United States Patent
Artman et al.

(10) Patent No.: US 7,990,087 B2
(45) Date of Patent: Aug. 2, 2011

(54) SYSTEM AND METHOD FOR PROVIDING COOLING FAN CHARACTERISTIC FEEDBACK

(75) Inventors: Paul T. Artman, Austin, TX (US); Sandor Farkas, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 473 days.

(21) Appl. No.: 12/255,251

(22) Filed: Oct. 21, 2008

(65) Prior Publication Data

US 2010/0097019 A1   Apr. 22, 2010

(51) Int. Cl.
  *H02P 6/16*   (2006.01)
(52) U.S. Cl. ............ 318/400.07; 318/602; 318/400.04; 318/461; 318/471
(58) Field of Classification Search .......... 318/162, 318/163, 601, 602, 400.04, 400.07, 456, 318/461, 471
See application file for complete search history.

(56) References Cited

U.S. PATENT DOCUMENTS

| | | | | |
|---|---|---|---|---|
| 6,008,603 A | * | 12/1999 | Jones et al. | 318/400.32 |
| 7,279,857 B2 | * | 10/2007 | Babb et al. | 318/400.23 |
| 7,327,114 B2 | * | 2/2008 | Verge et al. | 318/599 |
| 7,612,508 B2 | * | 11/2009 | Jreij et al. | 318/268 |
| 7,714,528 B2 | * | 5/2010 | Chen et al. | 318/599 |

OTHER PUBLICATIONS

U.S. Appl. No. 11/031,831, filed Jan. 7, 2005.

\* cited by examiner

*Primary Examiner* — Bentsu Ro
*Assistant Examiner* — Thai Dinh
(74) *Attorney, Agent, or Firm* — Larson Newman, LLP

(57) ABSTRACT

A device comprising a fan controller, an encoder, a driver, a resistor/capacitor filter, and a baseboard management controller. The fan controller is configured to output a cooling fan status signal, and to output a cooling fan information data signal. The encoder is configured to encode the cooling fan status signal and the cooling fan information data signal together into a combined signal. The driver is configured to invert the combined signal and to output an inverted signal. The resistor/capacitor filter is configured to filter out the cooling fan information data signal from the inverted signal, and to output a filtered signal. The baseboard management controller is configured to determine a status of a cooling fan in response to the filtered signal, and to output a control signal to the fan controller module for the cooling fan based on the cooling fan information data signal within the inverted signal.

20 Claims, 4 Drawing Sheets

SYSTEM AND METHOD FOR PROVIDING COOLING FAN CHARACTERISTIC FEEDBACK

FIELD OF THE DISCLOSURE

This disclosure generally relates to information handling systems, and more particularly relates to a system and method for providing cooling fan characteristic feedback.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

Information handling systems often have fans to cool constituent components. Such cooling fans have different characteristics, some of which may be customizable, such as the speed at which they operate. These speeds can vary based an amount of heat produced by the information handling system components. For example, as temperatures in the information handling system increase, the speed of the cooling fan is typically increased to cool the components.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
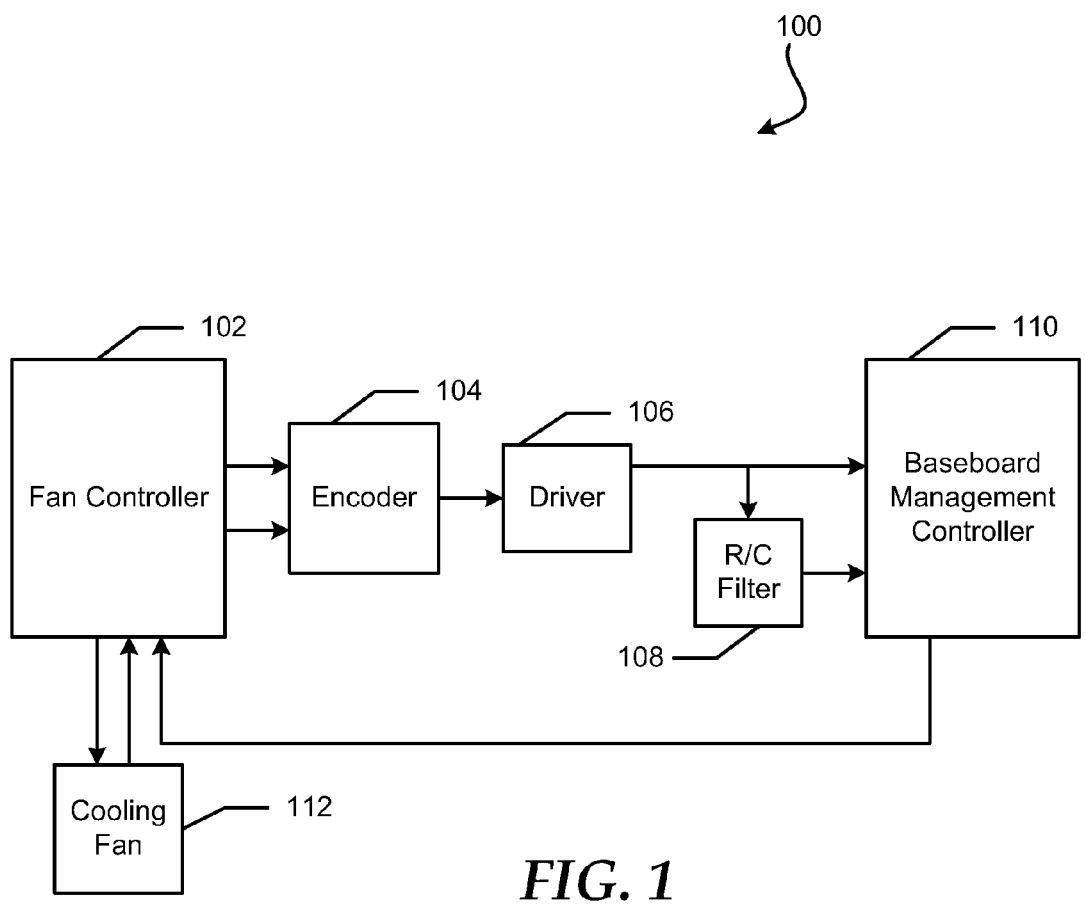
FIG. 1 is a block diagram of a cooling fan system for an information handling system.

FIG. 1 shows a cooling fan system 100 for an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The cooling fan system 100 includes a fan controller 102, an encoder 104, a driver 106, a resistor/capacitor (R/C) filter 108, a baseboard management controller (BMC) 110, and a cooling fan 112. The fan controller 102 has first and second input terminals, and first, second, and third output terminals. The encoder 104 has a first input terminal connected to the first output terminal of fan controller 102, a second input terminal connected to the second output terminal of the fan controller, and an output terminal. The driver 106 has an input terminal connected to the output terminal of the encoder 104, and an output terminal. The R/C filter has an input terminal connected to the output terminal of the driver 106, and an output terminal. The BMC 110 has a first input terminal connected to the output terminal of the driver 106, a second input terminal connected to the output terminal of the R/C filter 108, and an output terminal connected to the first input terminal of the fan controller 102. The cooling fan 112 has an input terminal connected to the third output terminal of the fan controller 102, and an output terminal connected to the second input terminal of the fan controller.

During operation, the fan controller 102 can provide a cooling fan status signal on the first terminal, and a cooling fan information data signal on the second terminal. The cooling fan status signal can be based on signals that the fan controller 102 receives from the cooling fan 112. The cooling fan status signal can be a static high voltage signal, a static low voltage signal, and/or a pulse width modulated (PWM) signal to indicate whether the cooling fan 112 is operating properly. In an embodiment, the static high voltage signal can indicate that the cooling fan is working properly, and the static low voltage signal can indicate that the cooling fan 112 in not working properly. Additionally, the PWM signal can indicate either that the cooling fan 112 is working properly or that the cooling fan 112 is not working properly based on a duty cycle of the PWM signal. The cooling fan information data signal can be a periodic high frequency PWM signal containing information about the cooling fan 112. The information can include a model, type, noise level, standard fan speed, and the like for the cooling fan 112.

The fan controller 102 can output the cooling fan status signal, such as a static high voltage signal to indicate that the cooling fan 112 is operating properly, on the first terminal. The fan controller 102 can also output the cooling fan information data signal on the second terminal. The encoder 104 can receive the cooling fan status signal and the cooling fan information data signal, and can combine the two signals together to form a combined signal. For example, if the cooling fan status signal is a static high voltage signal and the cooling fan information data signal is a periodic high frequency PWM signal, the combined signal output from the encoder 104 can be a constant high voltage signal with periodic high frequency PWM portions.

The driver 106 can receive and invert the combined signal to form an inverted signal. The driver 106 can also provide the inverted signal to the R/C filter 108 and to the first input terminal of the BMC 110. The R/C filter 108 can filter out the periodic high frequency PWM portion of the inverted signal, such that only the static portion of the inverted signal is provided to the second input terminal of the BMC 110. The BMC 110 can use the static portion of the inverted signal to determine whether the cooling fan 112 is operating properly. For example, if the static portion of the inverted signal is low, a determination can be made that the cooling fan 112 is operating properly. However, if the static portion of the inverted signal is high, a determination can be made that the cooling fan 112 is not working properly. The BMC 110 can also combine the output of the R/C filter 108 with the inverted signal from the driver 106 to retrieve the fan information data signal. Based on the fan information data signal, the BMC 110 uses a lookup table (not shown) stored within the BMC to determine the different characteristics of the cooling fan 112. The BMC 110 can then send a signal to the fan controller 102 indicating any change needed in the operation of the cooling fan 112 so that the cooling fan is operated efficiently, at a low noise level, and the like.

Figure 2:
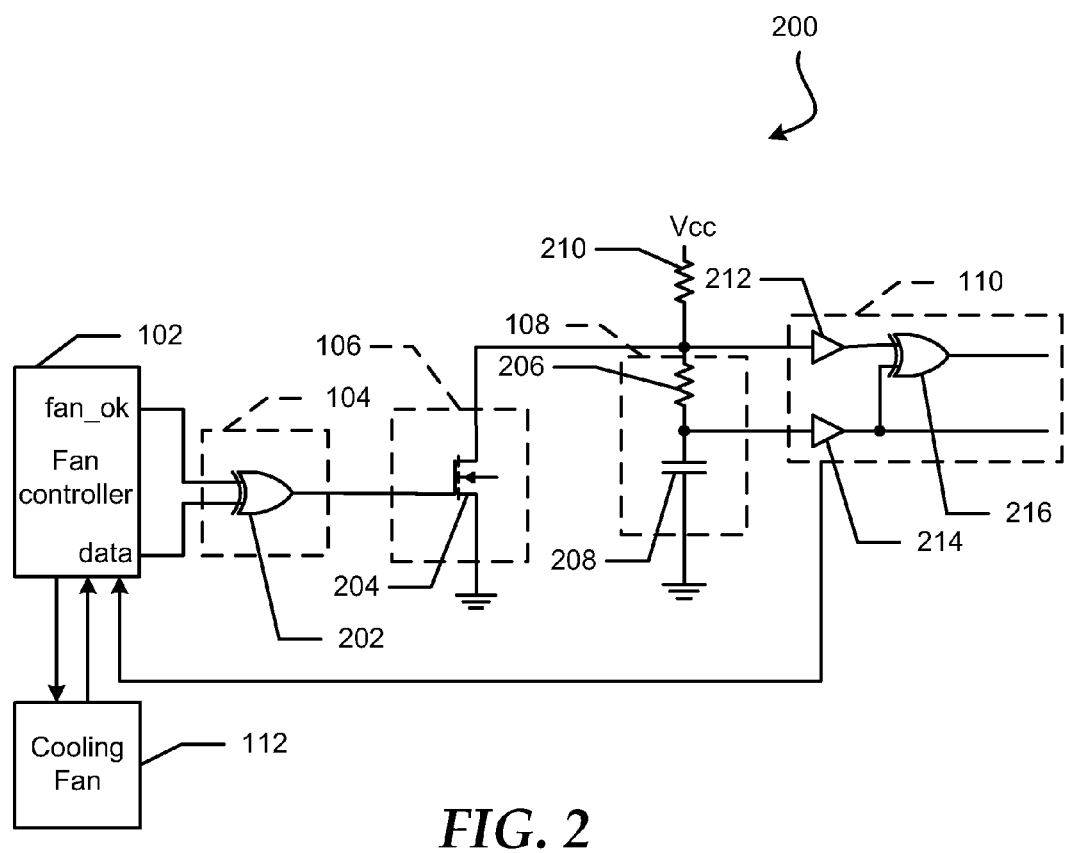
FIG. 2 is a partially block and partially schematic diagram of the cooling fan system.

FIG. 2 shows an embodiment of a cooling fan system 200 including an exclusive OR gate 202, a transistor 204, resistors 206, 208, and 210, buffers 212 and 214, and an exclusive OR gate 216. The encoder 104 includes the exclusive OR gate 202 having a first input terminal connected to the first output of the fan controller 102, a second input terminal connected to the second output of the fan controller, and an output terminal. The driver 106 includes the transistor 204 having a first current electrode, a second current electrode connected to a first voltage reference, labeled GND, and a control electrode connected to the output terminal of the exclusive OR gate 202. The R/C filter 108 includes the resistor 206 and the capacitor 208. The resistor 206 has a first terminal connected to the first current electrode of the transistor 204, and a second terminal. The capacitor 208 has a first terminal connected to the second terminal of the resistor 206, and a second terminal connected to the first voltage reference, GND.

The resistor 210 has a first terminal connected to a second voltage reference, labeled $V_{CC}$, and a second terminal connected to the first terminal of the resistor 206. The BMC 110 includes the buffers 212 and 214, and the exclusive OR gate 216. The buffer 212 has an input terminal connected to the first current electrode of the transistor 104, and an output terminal. The buffer 214 has an input terminal connected to the first terminal of the capacitor 208, and an output terminal. The exclusive OR gate 216 has a first input terminal connected to the output terminal of the buffer 212, a second input terminal connected to the output terminal of the buffer 214, and an output terminal.

Figure 3:
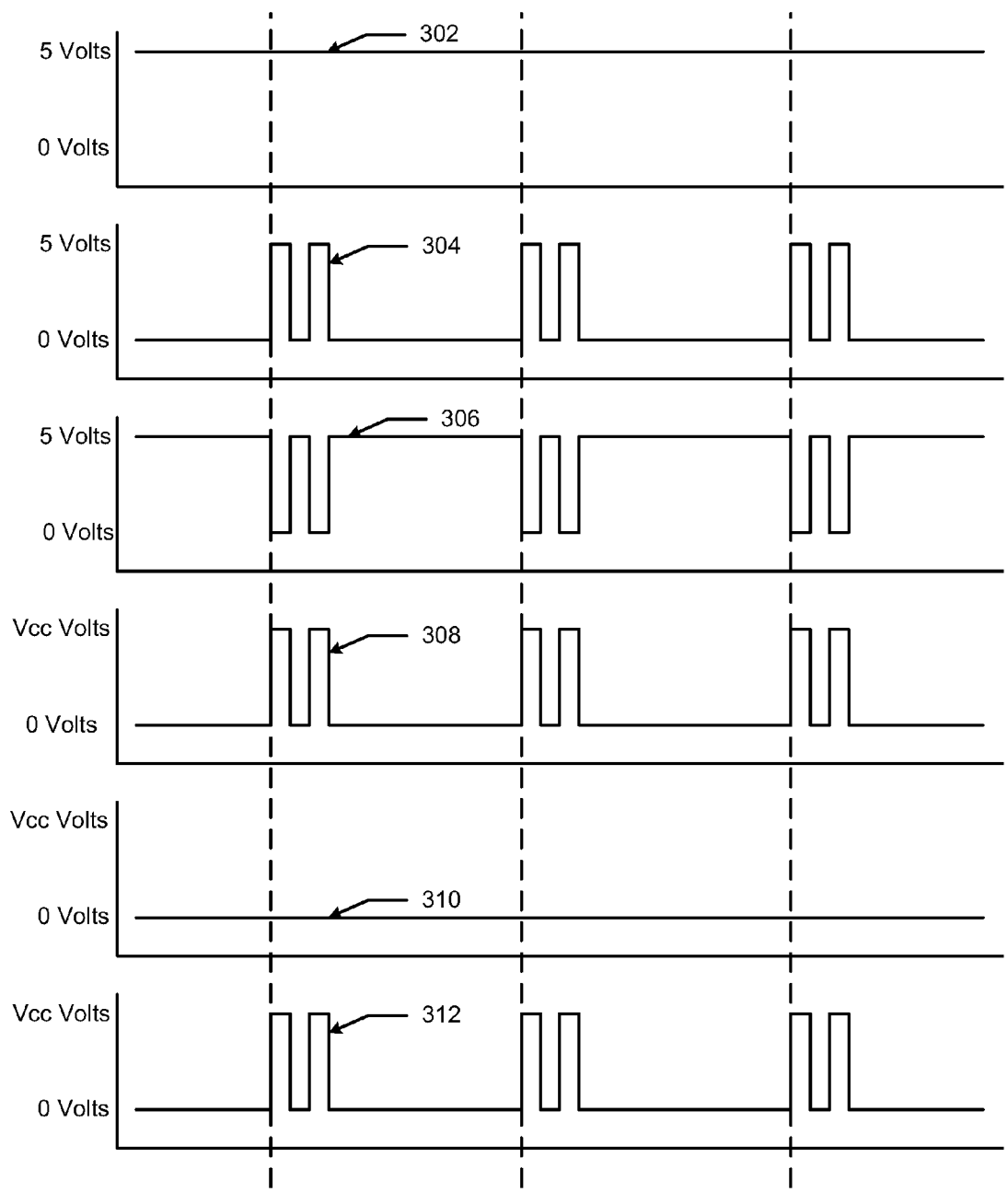
FIG. 3 is a timing diagram of a plurality of waveforms associated with the cooling fan system.

During operation, the fan controller 102 can output the cooling fan status signal on the first terminal, such as a constant high voltage signal to indicate that the cooling fan 112 is operating properly. The fan controller 102 can also output the cooling fan information data signal on the second terminal. The exclusive OR gate 202 can receive the cooling fan status signal on the first input terminal, and the cooling fan information data signal on the second input terminal. The exclusive OR gate 202 can combine the two signals together to form a combined signal. For example, the cooling fan status signal is a static high voltage signal, represented as waveform 302 shown in FIG. 3, and the cooling fan information data signal is a periodic high frequency high/low/high PWM signal, represented as waveform 304 shown in FIG. 3. Thus, the combined signal output from the exclusive OR gate 202 can be a constant high voltage signal with periodic high frequency low/high/low PWM portions of the combined signal, as represented as waveform 306 shown in FIG. 3.

The transistor 204 can receive the combined signal from the exclusive OR gate 202 at the control electrode. The transistor 204 can operate as an inverting switch, such that the voltage across the transistor is either zero volts or substantially equal to the second voltage reference, $V_{CC}$, coupled to the first current electrode. For example, if the combined signal is high the transistor 204 is activated, causing the transistor to operate as a short circuit and the voltage at the first current electrode to be pulled to ground. If the combined signal is low, the transistor 204 is not activated, causing the transistor to operate as an open circuit and the voltage at the first current electrode to be substantially equal to the second voltage reference, $V_{CC}$. Thus, an inverted signal output from the transistor 208 can be a constant low voltage signal with periodic high frequency high/low/high PWM portions, as represented by waveform 308 shown in FIG. 3.

The resistor 206 and the capacitor 208 combine to form the R/C filter 108. The R/C filter 108 can be designed to have a low frequency response, so that high frequency signals are filtered out by the resistor 206 and the capacitor 208. The fan information data portion can be a high frequency signal, so that the only portion of the inverted signal provided to the BMC 110 via the buffer 214 is an inverse of the fan status signal, as represented by waveform 310 shown in FIG. 3. The BMC 110 can use the inverse of the cooling fan status signal to determine whether the cooling fan 112 is operating properly. For example, a constant low voltage, at the BMC 110, can indicate that the cooling fan 112 is operating properly, and a constant high voltage can indicate that the cooling fan is not operating properly.

The inverted signal can be provided to the first input terminal of the exclusive OR gate 216 via the buffer 212, and the inverse of the cooling fan status signal can be provided to the second input terminal of the exclusive OR gate via the buffer 214. The exclusive OR gate 216 can combine the two signals to substantially recover the cooling fan information data signal, as represented by waveform 312 shown in FIG. 3. The BMC 110 can use the cooling fan information data signal to determine the different characteristics of the cooling fan 112, such as efficiency, amount of noise produced by the cooling fan, the cooling fan speed, and the like, from a lookup table in the BMC. Based on the characteristics of the cooling fan 112, the BMC 110 can send a control signal to the fan controller 102 to change the control of the cooling fan 112 so that the cooling fan can be operated efficiently.

Figure 4:
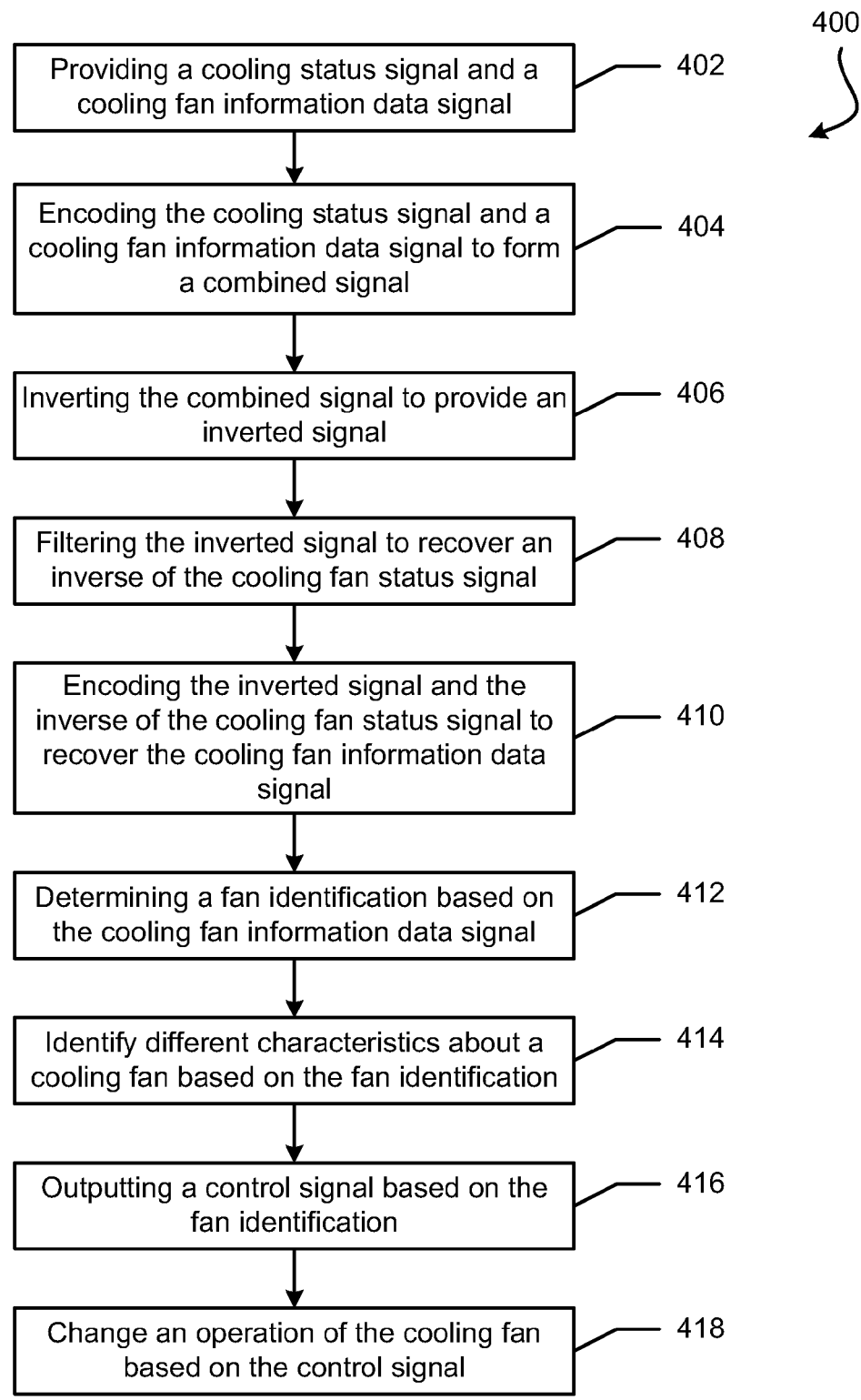
FIG. 4 is a flow diagram of a method for providing a cooling fan characteristic feedback signal in the cooling fan system.

FIG. 4 shows a flow diagram of a method 400 for receiving a cooling fan characteristic feedback signal. At block 402, a cooling fan status signal and a cooling fan information data signal are provided to an encoder. The cooling fan status signal can indicate whether a cooling fan is operating properly, and can be a static high or low voltage signal, a PWM signal, and the like. The cooling fan information signal can represent a fan type, a fan model, an efficiency of the fan, a rotation speed of the fan, an amount of noise produced by the fan, and the like. The cooling fan information signal can be a periodic high frequency PWM signal. At block 404, the cooling fan status signal and cooling fan information data signal are encoded together to form a combined signal.

The combined signal is inverted to create an inverted signal at block 406. At block 408, the inverted signal is filtered to recover an inverse of the cooling fan status signal. The inverted signal is encoded with the inverse of the cooling fan status signal to recover the cooling fan information data signal at block 410. At block 412, fan identification for the cooling fan is determined based on the cooling fan information data signal. Different characteristics for a cooling fan are identified based on the cooling fan information data signal and in response to determining the fan identification at block 414. A control signal is output based on the fan identification at block 416. At block 418, an operation of the cooling fan is changed based on the control signal.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A device comprising:
   a fan controller having first and second output terminals, the fan controller being configured to output a cooling fan status signal on the first output terminal, and further configured to output a cooling fan information data signal;
   an encoder module having a first input terminal connected to the first output of the fan controller, a second input terminal connected to the second output terminal of the fan controller, and an output terminal, the encoder module configured to encode the cooling fan status signal and the cooling fan information data signal together into a combined signal;
   a driver having an input terminal connected to the output terminal of the encoder module, and an output terminal, the driver configured to invert the combined signal and to output an inverted signal;
   a resistor/capacitor (R/C) filter having an input terminal connected to the output terminal of the driver, and an output terminal, the R/C filter configured to filter out the cooling fan information data signal from the inverted signal, and further configured to output a filtered signal; and
   a baseboard management controller having a first input terminal connected to the output terminal of the driver, and a second input terminal connected to the output terminal of the R/C filter, the baseboard management controller configured to determine a status of a cooling fan in response to the filtered signal, and further configured to output a control signal to the fan controller module for the cooling fan based on the cooling fan information data signal within the inverted signal.

2. The device of claim 1 wherein encoder module comprises:
   an exclusive OR gate having a first input terminal connected to the first output terminal of the fan controller, a second input terminal connected to the second output terminal of the fan controller, and an output configured to provide the cooling fan status signal and the cooling fan information data signal combined together as the combined signal.

3. The device of claim 1 wherein the driver comprises:
   a transistor having a first current electrode coupled to a first voltage reference, a second current electrode connected to a second voltage reference, and a control electrode connected to the output of the encoder, the transistor adapted to invert the combined signal.

4. The device of claim 1 wherein the R/C filter comprises:
   a resistor having a first terminal connected to the output of the driver, and a second terminal; and
   a capacitor having a first terminal connected to the second terminal of the resistor, and a second terminal connected to a voltage reference.

5. The device of claim 1 wherein the baseboard management controller comprises:
   a first buffer having an input terminal connected to the output of the driver, and an output terminal;
   a second buffer having an input terminal connected to the output of the R/C filter, and an output terminal; and
   an exclusive OR gate having a first input terminal connected to the output of the first buffer, a second input terminal connected to the output of the second buffer, and an output configured to provide the cooling fan information data signal.

6. The device of claim 1 wherein the cooling fan information data signal is selected from a group consisting of a cooling fan type, a cooling fan number, a cooling fan rotation speed, and a cooling fan noise level.

7. The device of claim 1 wherein the baseboard management controller is further configured to identify different characteristics about the cooling fan based on the cooling fan information data signal.

8. The device of claim 1 wherein the cooling fan information signal is a periodic high frequency pulse width modulated signal.

9. The device of claim 1 wherein the cooling fan status signal is selected from a group consisting of a static high voltage signal, a static low voltage signal, and a low frequency pulse width modulated signal.

10. A device comprising:
    a fan controller module having first and second output terminals, the fan controller being configured to output a cooling fan status signal on the first output terminal, and further configured to output a cooling fan information data signal;
    a first exclusive OR gate having a first input terminal connected to the first output terminal of the fan controller, a second input terminal connected to the second output terminal of the fan controller, and an output configured to combine the cooling fan status signal and the cooling fan information data signal into a combined signal;
    a transistor having a first current electrode coupled to a first voltage reference, a second current electrode connected to a second voltage reference, and a control electrode connected to the output of the first exclusive OR gate, the transistor adapted to invert the combined signal of the first exclusive OR gate;

a resistor having a first terminal connected to the first current electrode of the transistor, and a second terminal;

a capacitor having a first terminal connected to the second terminal of the resistor, and a second terminal connected to the second voltage reference, the capacitor and the resistor forming a resistor/capacitor filter to filter out the cooling fan information data signal; and a baseboard management controller comprising:

a second exclusive OR gate having a first input terminal coupled to the first current electrode of the transistor, a second input terminal coupled to the first terminal of the capacitor, and an output configured to provide the cooling fan information data signal.

11. The device of claim 10 wherein the cooling fan information signal is a periodic high frequency pulse width modulated signal.

12. The device of claim 10 further comprising:

a first buffer having an input terminal connected to the first current electrode of the transistor, and an output terminal;

a second buffer having an input terminal connected to the first terminal of the capacitor, and an output terminal.

13. The device of claim 10 wherein the cooling fan status signal is selected from a group consisting of a static high voltage signal, a static low voltage signal, and a low frequency pulse width modulated signal.

14. A method comprising:

providing a cooling fan status signal and a cooling fan information data signal;

encoding the cooling fan status signal with the cooling fan information data signal to produce a combined signal;

inverting the combined signal to produce an inverted signal;

filtering the inverted signal to recover an inverse of the cooling fan status signal;

encoding the inverted signal with the inverse of the cooling fan status signal to recover the cooling fan information data signal;

determining a fan identification based on the cooling fan information data signal; and outputting a control signal based on the fan identification.

15. The method of claim 14 further comprising:

identifying different characteristics about a cooling fan based on the cooling fan information data signal in response to determining the fan identification.

16. The method of claim 14 wherein the cooling fan information data signal is selected from a group consisting of a cooling fan type, a cooling fan number, a cooling fan rotation speed, and a cooling fan noise level.

17. The method of claim 14 wherein the cooling fan status signal is selected from a group consisting of a static high voltage signal, a static low voltage signal, and a low frequency pulse width modulated signal.

18. The method of claim 14 wherein the cooling fan information signal is a periodic high frequency pulse width modulated signal.

19. The method of claim 14 wherein providing the cooling fan status signal and the cooling fan information data signal is from a fan controller.

20. The method of claim 14 further comprising:

changing an operation of a cooling fan based on control signal.

* * * * *